(12) United States Patent
Venas

(10) Patent No.: US 9,197,211 B2
(45) Date of Patent: Nov. 24, 2015

(54) RESET SYNCHRONIZATION LOGIC CIRCUIT

(71) Applicant: NORDIC SEMICONDUCTOR ASA, Trondheim (NO)

(72) Inventor: Arne Wanvik Venas, Trondheim (NO)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 0 days.

(21) Appl. No.: 14/336,999

(22) Filed: Jul. 21, 2014

(65) Prior Publication Data

US 2015/0022252 A1    Jan. 22, 2015

(30) Foreign Application Priority Data

Jul. 22, 2013 (GB) .................................. 1313047.1

(51) Int. Cl.
*H03L 7/00* (2006.01)
*H03K 19/00* (2006.01)
*H03K 3/012* (2006.01)
*H03K 3/037* (2006.01)

(52) U.S. Cl.
CPC ............ *H03K 19/0016* (2013.01); *H03K 3/012* (2013.01); *H03K 3/037* (2013.01)

(58) Field of Classification Search
CPC ..... H03K 19/0016; H03K 3/012; H03K 3/037
USPC .......................................... 327/141, 142, 198
See application file for complete search history.

(56) References Cited

U.S. PATENT DOCUMENTS

| 3,575,215 | A | * | 4/1971 | Boddy | 327/98 |
| 3,612,906 | A | * | 10/1971 | Kennedy | 327/155 |
| 5,790,112 | A | * | 8/1998 | Hwang | 345/213 |
| 5,966,119 | A | * | 10/1999 | Hwang | 345/213 |
| 6,075,418 | A | * | 6/2000 | Kingsley et al. | 331/57 |
| 6,144,262 | A | * | 11/2000 | Kingsley | 331/57 |
| 6,650,162 | B2 | * | 11/2003 | Dubey | 327/291 |
| 7,394,885 | B2 | * | 7/2008 | Giunco et al. | 375/376 |
| 8,228,748 | B2 | * | 7/2012 | Park et al. | 365/194 |

* cited by examiner

*Primary Examiner* — Kenneth B Wells
(74) *Attorney, Agent, or Firm* — Koppel, Patrick, Heybl & Philpott

(57) ABSTRACT

A digital circuit portion comprises a flip-flop (20) having a clock input (22) and an output (data); a clock signal (ck); and a gate (24) between said clock signal (ck) and said clock input (22), said gate (24) being arranged selectively to couple the clock signal (ck) to the clock input (22) in dependence upon the output of the flip-flop (20).

3 Claims, 9 Drawing Sheets

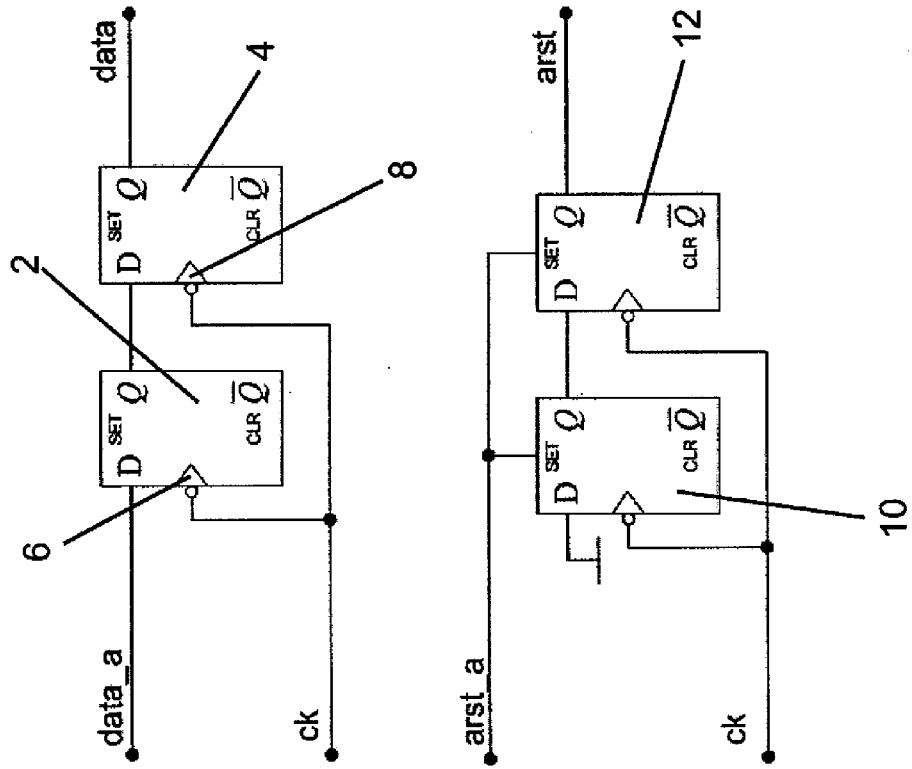

1

RESET SYNCHRONIZATION LOGIC CIRCUIT

This invention relates to digital circuits which include flip-flops. Flip-flops are a simple yet valuable building block of most digital circuits. Flip-flops rely on having a clock signal at their clock input in order for them to operate.

The present inventor has appreciated that where the status of a flip-flop does not change very often it is theoretically wasteful to keep the clock signal running to it since there is inherently a cost associated with this in terms of power consumption. He has further appreciated, however, that a normal Integrated Clock Gate (ICG) cannot be used practically to reduce power consumption. First an ICG requires an enable signal which is synchronous with its clock and that will often not be available. Perhaps more fundamentally however the power consumption of an ICG is typically higher than that of a flip-flop and thus such an arrangement would not in fact represent a power saving, at least when used to control a single flip-flop.

When viewed from a first aspect the invention provides a digital circuit portion comprising:
a flip-flop having a clock input and an output;
a clock signal; and
a gate between said clock signal and said clock input, said gate being arranged selectively to couple the clock signal to the clock input in dependence upon the output of the flip-flop.

Thus it will be seen by those skilled in the art that in accordance with the invention the status of the output of the flip-flop, such as the Q output, is used to control the supply of the clock signal to the flip-flop. It will be particularly appreciated by those skilled in the art that effectively coupling an output signal from a flip-flop to its clock input is strongly considered to represent bad design and would normally be completely discouraged. However the present inventor has appreciated the potential benefits thereof, in particular that it provides an arrangement which allows the clock signal to be supplied only when it is required, thereby saving power, even in a non-synchronous context. Moreover the benefit of using an ordinary logic gate, rather than an ICG is that it does not require a synchronous Enable signal and has a much lower power consumption. In fact the input capacitance of a typical logic gate is lower than the input capacitance of a typical flip-flop, often only a fraction of the capacitance, which therefore reduces the load on the clock tree.

The gate coupling the clock signal to the clock input may comprise an AND gate, a NAND gate or a logically equivalent arrangement.

Arrangements in accordance with the invention may be employed beneficially to gate a single flip flop and a power saving may be achieved in such a configuration. Equally however they may be used to gate a plurality of flip flops. In a set of embodiments the gate is used to couple the clock signal to the clock inputs of a plurality of flip-flops arranged in series—that is with the output of one flip-flop being connected to the input of the next in the series. Such an arrangement may be used for synchronisation of a data signal.

In another set of embodiments the gate is used to couple the clock signal to the clock inputs of a plurality of flip-flops arranged in parallel—that is with each flip-flop receiving an independent input. This arrangement could be used for example in the context of a bus. In an exemplary set of such embodiments the gate is arranged to supply a clock signal to the flip-flops if the input on any channel of the bus differs from its output.

Any combination of flip-flops connected in series or in parallel may be used.

In a set of embodiments the gate selectively coupling the clock signal to the clock input is controlled on the basis of a comparison between the output of the flip-flop and an input, such as the D input, thereof. This allows the clock to be supplied to the flip-flop when its input differs from its output which indicates that there is new data to be passed across and therefore that the flip-flop should be activated by the clock. For as long as the output is the same as the input, that indicates that there is no new data to transfer and thus no need to supply the clock signal, thereby allowing power saving.

In another set of embodiments an arrangement in accordance with the invention is used for self-gating of a reset synchronisation logic arrangement. For example this may comprise two or more flip-flops in series with the input to the first held at a fixed logic level—e.g. grounded—such that the output of the first represents an at least partially synchronised version of an asynchronous reset signal applied to the SET input of both flip-flops. Of course more than two flip-flops may be used in series as is known per se in the art.

Many different combinations of the arrangements set out above are possible. For example a gate may be used to couple a clock signal to the clock inputs of respective flip-flops arranged for synchronisation of data and reset signals.

Certain embodiments of the invention will now be described, by way of example only, with reference to the accompanying drawings in which:

FIG. 1 is a circuit diagram of a conventional arrangement for a flip-flop data synchronisation register, shown for reference purposes only;

FIG. 2 is a circuit diagram of a conventional arrangement for synchronisation of a reset signal, shown for reference purposes only;

Figure 4:
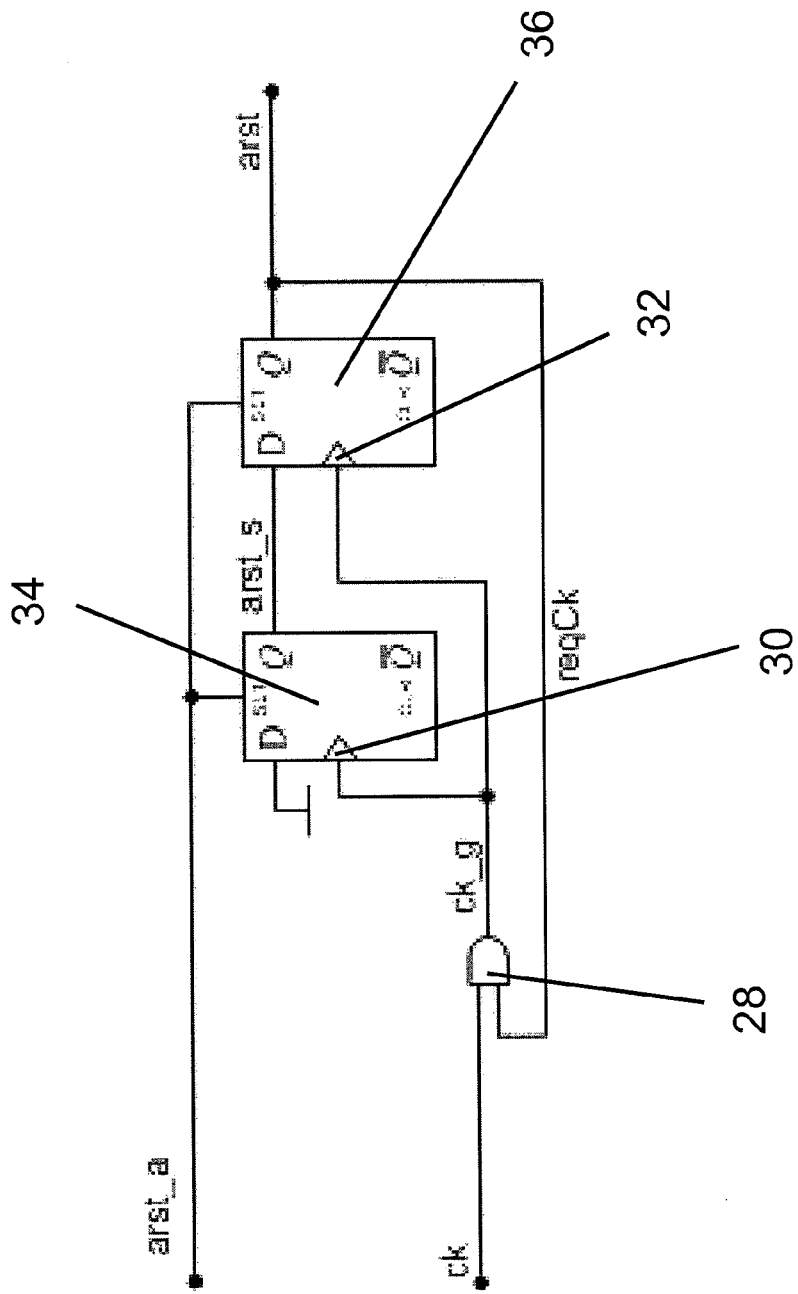
FIG. 4 is a circuit diagram of an embodiment of the invention used for self-gating of a pair of flip-flops for reset synchronisation.
Figure 7:
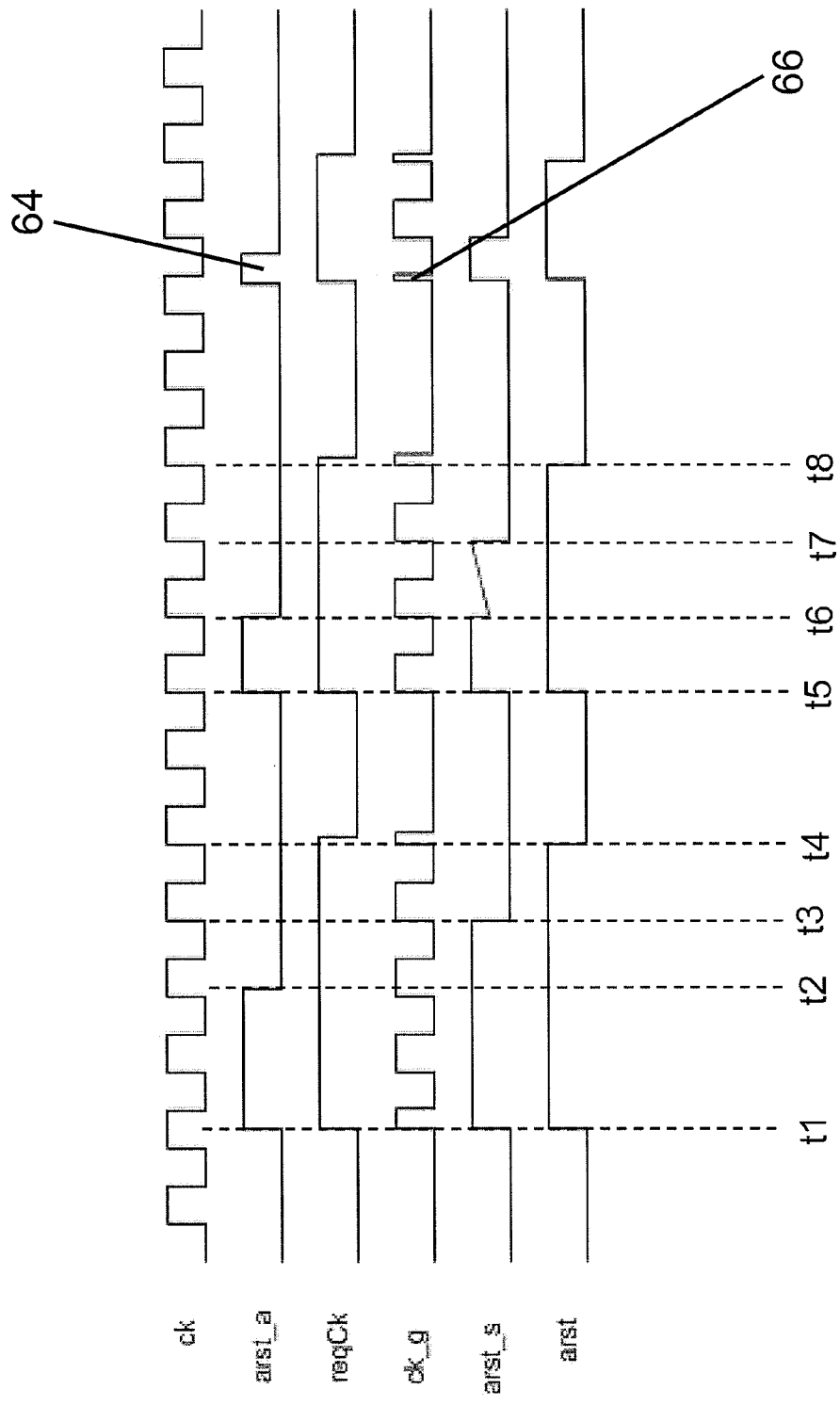
Figure 8:
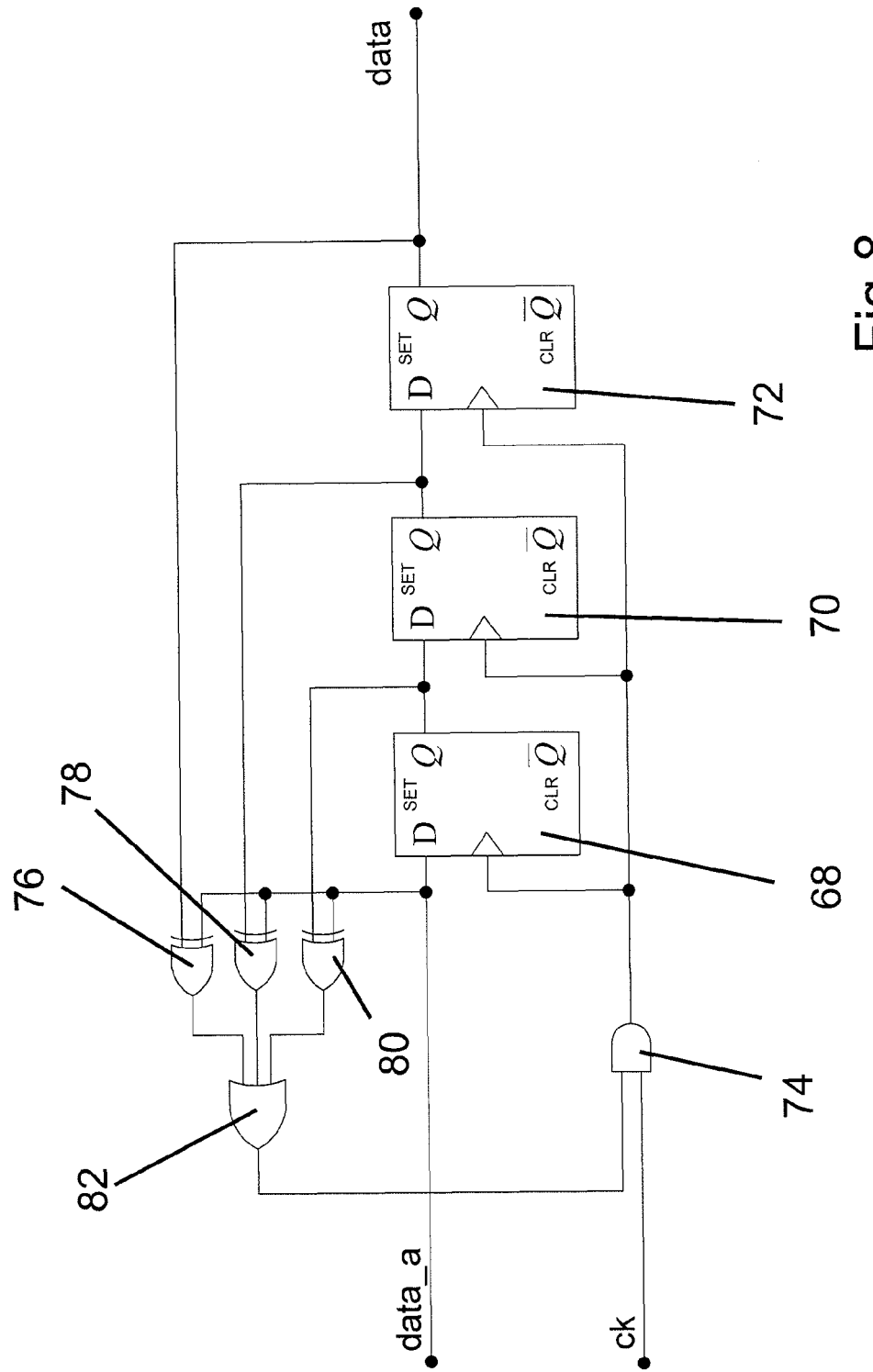
Figure 9:
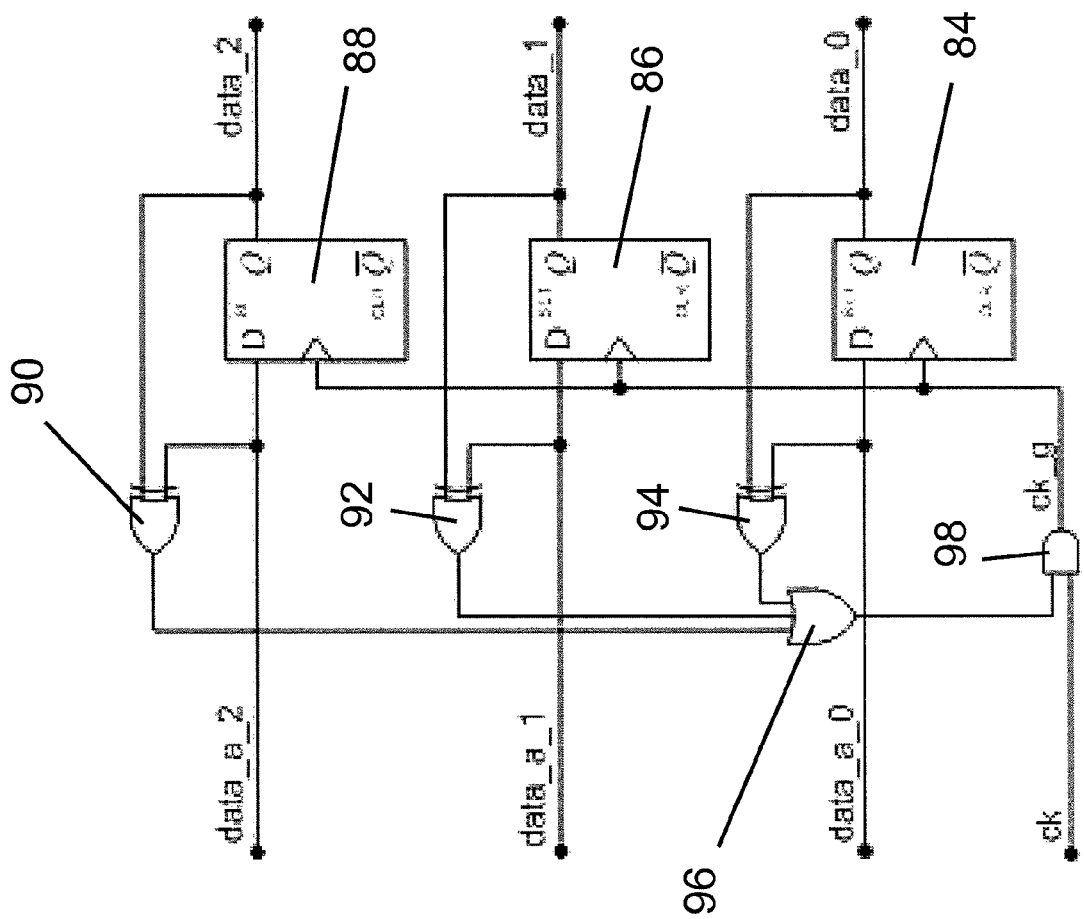
Figure 10:
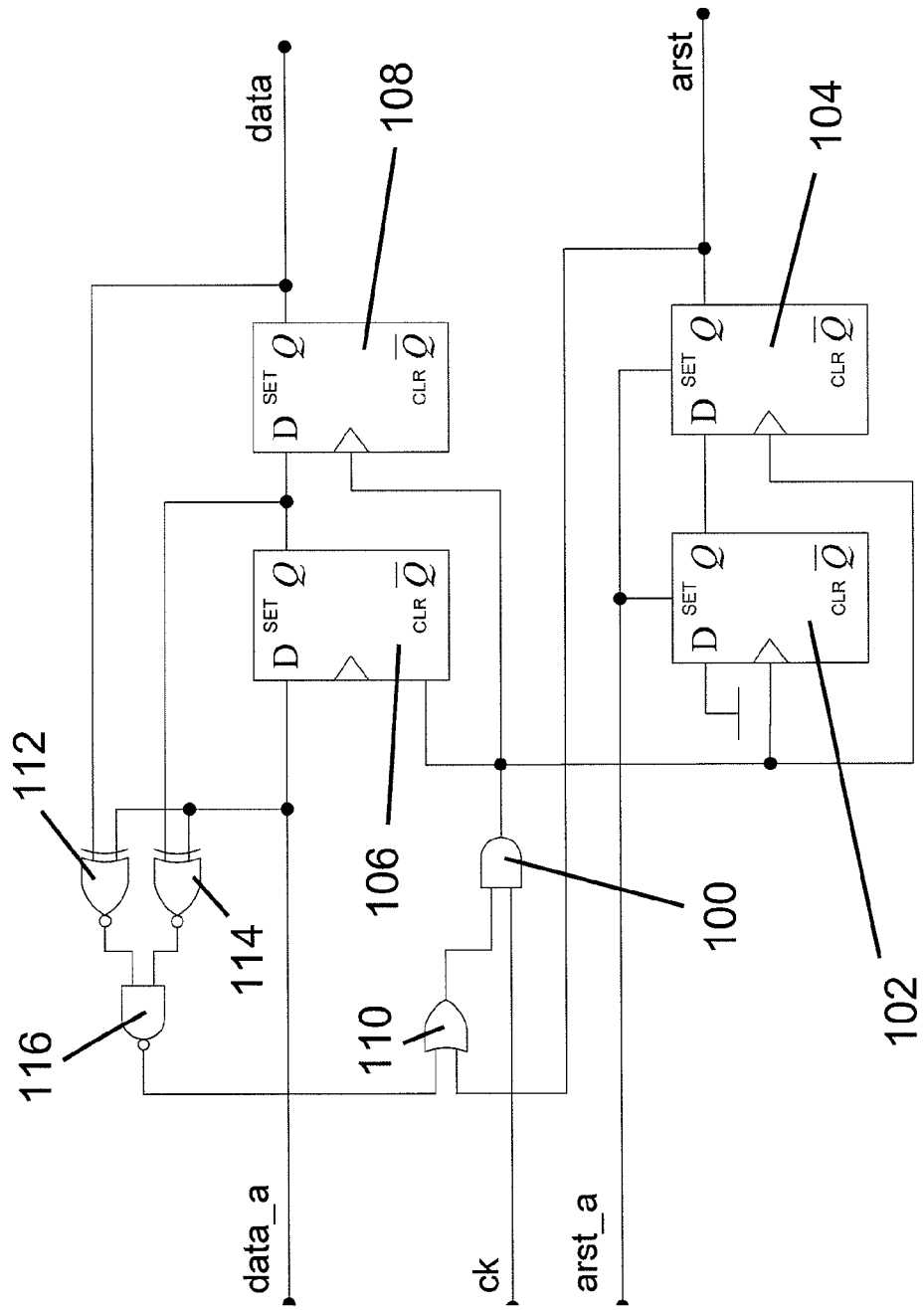

FIG. 7 is a timing diagram illustrating the signals at various points in the circuit of FIG. 4, FIG. 8 is a circuit diagram of an embodiment of the invention similar to the embodiment of FIG. 4 with three flip-flops FIG. 9 is a circuit diagram of an embodiment of the invention used for self-gating of a data bus; and FIG. 10 is a circuit diagram of an embodiment of the invention used for self-gating of an arrangement for data and reset synchronisation.

Turning first to FIG. 1 there may be seen a conventional data synchronisation flip-flop arrangement. Here the asynchronous data input data_a is fed to the D input of a standard flip-flop register 2. The Q output of the flip-flop 2 is fed to a second flip-flop 4. A clock signal ck—e.g. supplied ultimately by a crystal oscillator or other clock source—is supplied to the respective clock inputs 6, 8 of the two flip flops 2, 4.

As is well known to those skilled in the art, this arrangement ensures that the output, data, from the second flip-flop 6 is clean and synchronised to the clock, ck as the signal is clocked through both flip-flops 2, 4. The second flip-flop 4 ensures that the output is clean even if the Q output of the first flip-flop is meta-stable—e.g. because its input, data_a changes very close to a rising edge of the clock signal, ck (assuming that the flip-flop is clocked on the rising edge).

FIG. 2 is another conventional arrangement in which an asynchronous reset signal, arst_a can by synchronised to a clock signal, ck. Here the reset signal, arst_a is applied to the SET input of each of a pair of serial flip-flops 10, 12. The D input of the first flip-flop 10 is grounded so that the steady state of the Q output of the second flip-flop 12 is zero. However when the reset signal, arst_a goes high, the Q outputs of both flip-flops goes high. Again the second flip-flop 12 ensures that there is a clean signal at its Q output regardless of when the arst_a signal changes.

Figure 3:
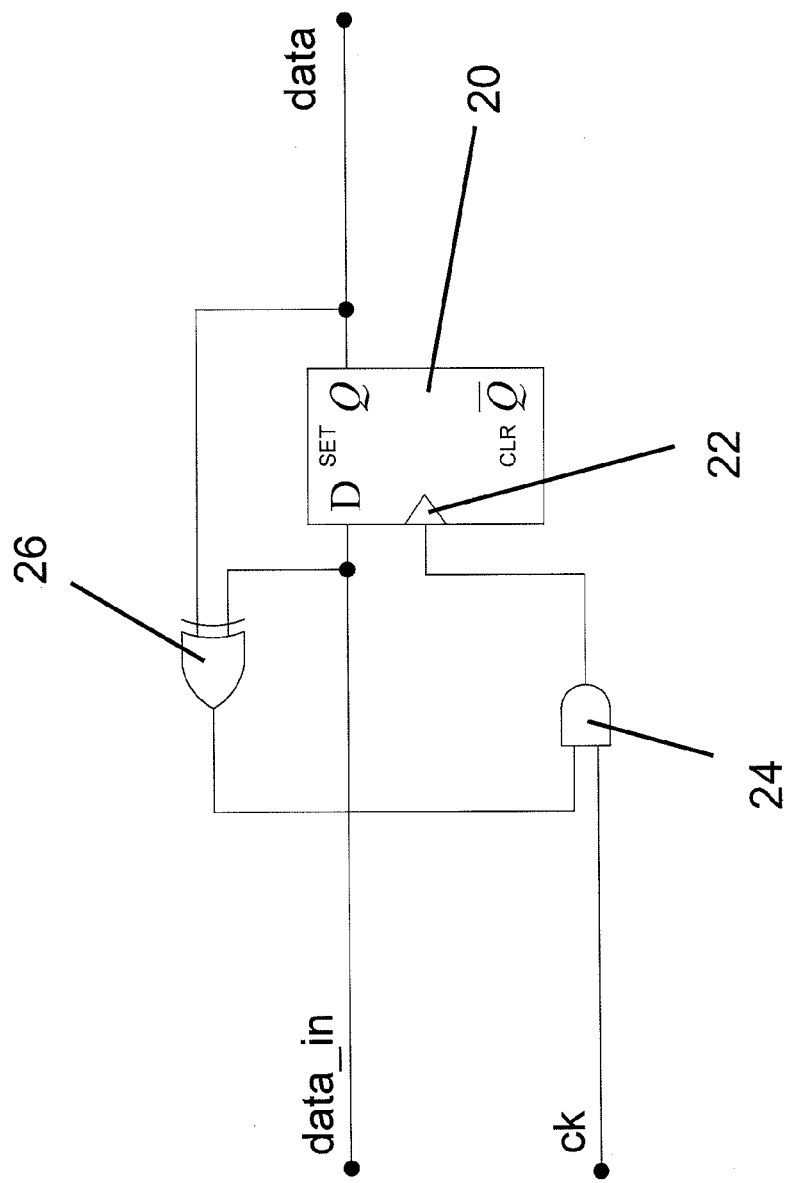
FIG. 3 is a circuit diagram of an embodiment of the invention used for self-gating of a flip-flop register.

A possible embodiment of the invention is shown in FIG. 3. This shows how the self-gating principle can be applied to a synchronous data register comprising a single flip-flop 20. It will be noted that in comparison with the arrangement shown in FIGS. 1 and 2, the clock signal, ck is not coupled directly to the clock input 22 but rather is connected as one input to an AND gate 24, the output of which is connected to the clock input 22. The other input to the AND gate 24 is the output of an XOR gate 26, the inputs of which are the D input (i.e. the incoming synchronous data signal, data_in) and the Q output of the flip-flop 20.

As may be appreciated from this arrangement, when the D input and Q output are at the same logic level the output from the XOR gate 26 is low and so the clock signal ck is not coupled to the clock input 22 by the AND gate 24. However when the data_in signal changes from low to high or vice versa, the output of the XOR gate 26 goes high, allowing the positive clock pulses from the clock signal ck to pass through the AND gate 24 to the clock input 22 and so clock the new data bit through the flip-flop 20 to the Q output. It should be noted however that this design is not able to handle a short clock pulse when the data signal changes close to a falling edge of the clock. This would give a metastable signal on data, which is not acceptable.

The clock pulse supplied to the clock input is likely to be very short compared to a standard clock pulse. However the Applicant has appreciated that the minimum clock pulse which can be tolerated by a flip-flop is quite short as long as there is no change in the data_in signal close to a falling edge in the clock pulse. Thus in some circumstances there will not normally be any problems with a short clock pulse assuming that the delay from the clock input 22 to the Q output through the XOR gate 26, AND gate 24 and back to the clock input 22 is longer than the minimum clock pulse, which is a condition satisfied by normal flip-flops. The data_in signal should be glitch-free, e.g. coming directly from another flip-flop, since a glitch in the data_in signal might give false clock pulses.

It will be appreciated therefore that this embodiment requires that the synthesis and layout of the rest of the circuit is designed so that the data_in signal does not change close to the negative edge of the clock. In practice this means that the data can only be allowed to change when the clock is zero. This arrangement therefore illustrates the principle behind the invention but is likely to be of relatively limited use in practice as a result of these restrictions.

In the next clock pulse if the data_in does not change again, the inputs of the XOR gate 26 will once more be equalised and so its output goes low. This closes the AND gate 24 so that the clock signal ck is no longer passed through to the clock input 22. On the other hand if the data_in does change again on the next clock pulse then this will again lead to a difference between the inputs of the XOR gate 26, keeping its output high and so allowing the next clock pulse through the AND gate 24 to the clock input which clocks the next data bit through the flip-flop 20.

It can be seen therefore that when there is no new data to be clocked through the flip-flop 20, the clock signal ck is not coupled to the clock input 22. This represents a power saving since the input capacitance of an AND gate is typically only a fraction of the input capacitance of the clock input of a flip-flip. This means that while the data is not changing, there is a significantly lower burden on the clock tree.

FIG. 4 shows an arrangement in accordance with the invention for self-gating of a reset signal. In comparison with the corresponding conventional arrangement shown in FIG. 2 it may be seen that again there is an AND gate 28 inserted between the clock signal ck and the clock inputs 30, 32 of the flip-flops 32, 34. Here the other input of the AND gate 28 is simply taken from the Q output of the second flip-flop 36—i.e. the synchronised reset signal, arst—since this output will always go high when the asynchronous reset signal arst_a, which is fed to the SET input, goes high. As in the previous embodiment this arrangement saves power over the conventional arrangement (shown in FIG. 2) whenever there is no reset signal to clock through. Given that reset signals are typically relatively rare, the power saving could be quite significant. Alternatively, if it is not the case that the reset signal is zero most of the time, clock gating using an XOR gate could be used instead. The same applies to the data signal.

Figure 5:
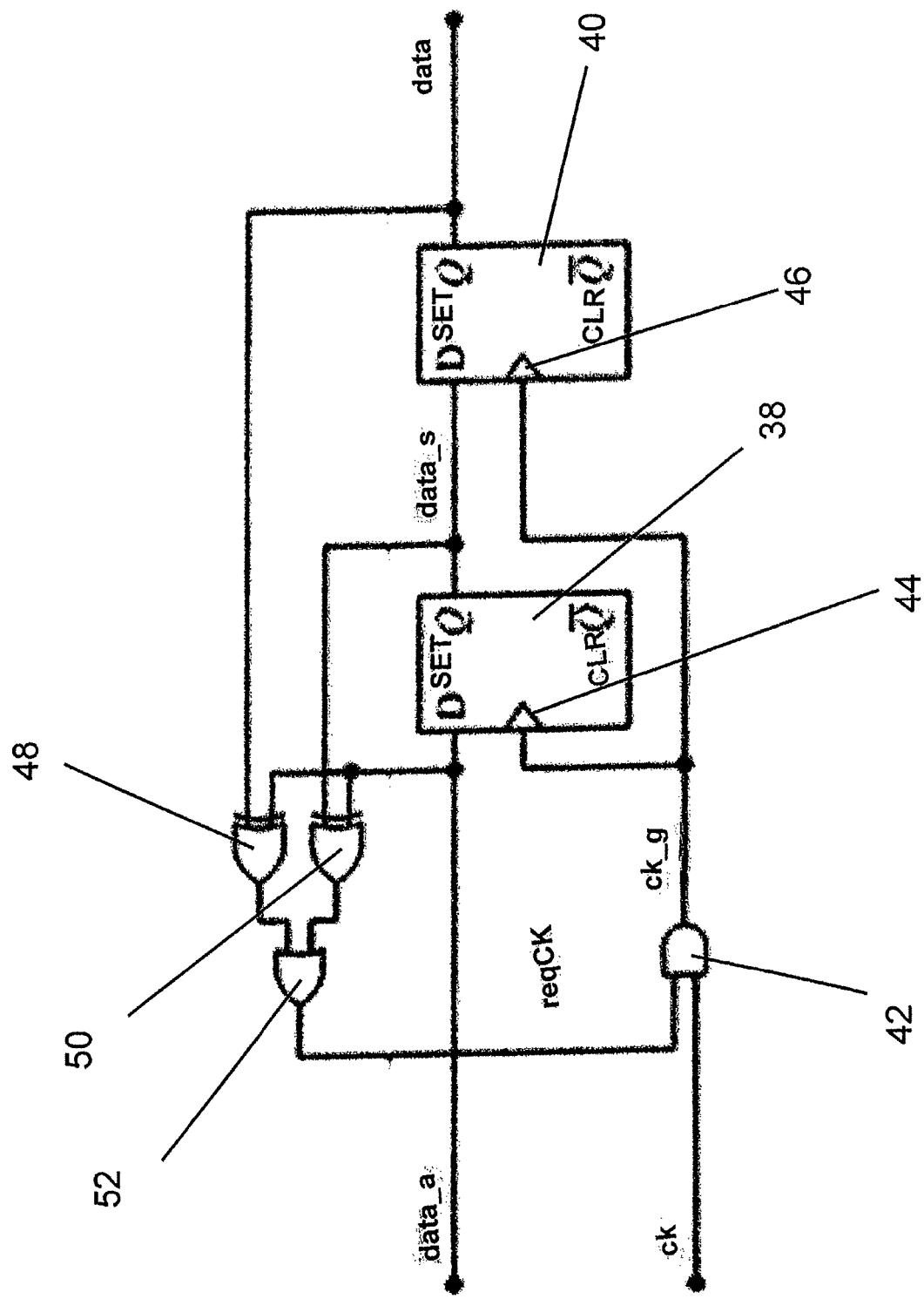
FIG. 5 is a circuit diagram of an embodiment of the invention used for self-gating of a pair of flip-flops for data synchronisation.

As will be appreciated by those skilled in the art, it is quite unconventional to have the output of a component such as a flip-flop connected to its own clock input and this would normally lead the skilled person to avoid any such situation for fear of giving rise to meta-stable states which is a significant concern for digital circuit designers. The basis for this fear may be better understood with reference to FIGS. 5, 6 and 7 but so too may the reason why the fear turns out in fact to be unfounded in some circumstances FIG. 5 shows an extended version of the arrangement shown in FIG. 3. Here, rather than a single flip-flop there is a pair of flip-flops 38, 40 in series. The asynchronous data signal data_a is fed to the D input of the first flip-flop 38 and the Q output of the first flip-flop 38 is fed to the D input of the second flip-flop 40. The signal passing between them is labelled data_s. The Q output of the second flip-flop 40 provides the synchronised data output, data.

The AND gate 42 is used to couple the clock signal ck to the respective clock inputs 44, 46 of the two flip-flops 38, 40 by means of a gated clock signal cg_k.

One XOR gate 48 is used to compare the data_a and data signals whilst a second XOR gate 50 is used to compare data_a and data_s. The two XOR gates feed an OR gate 52 which is used to control the clock gating AND gate 42 through a clock request signal reqCk. This arrangement means that the clock signal ck is provided to the flip-flops 38, 40 if the incoming asynchronous data signal data_a differs from either of their Q outputs.

Figure 6:
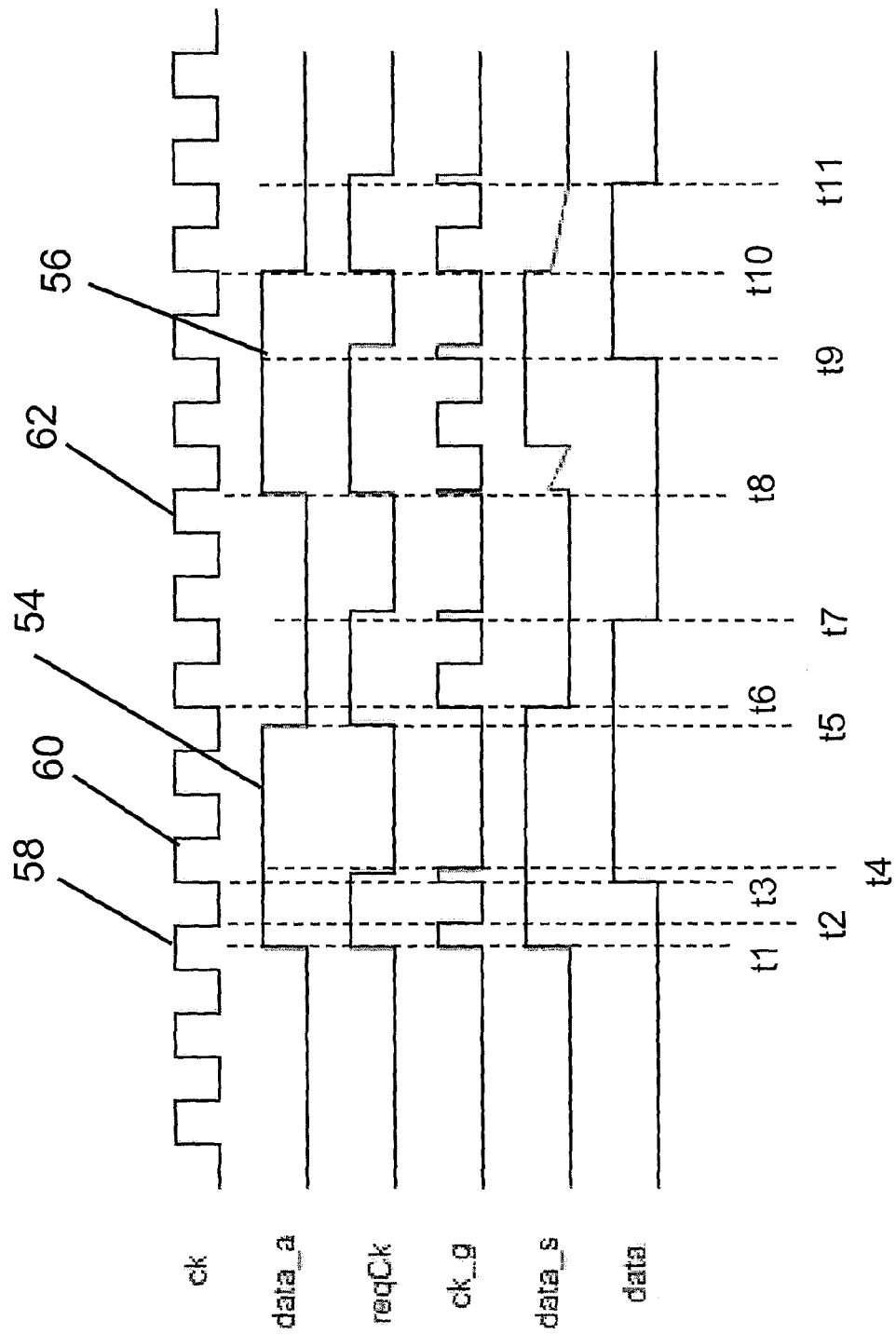
FIG. 6 is a timing diagram illustrating the signals at various points in the circuit of FIG. 5.

Operation of the embodiment of FIG. 5 may be further understood with reference to FIG. 6 which shows a timing diagram for the various signals mentioned above. Thus the top line shows the clock signal ck and the one beneath it the asynchronous data input data_a. It may indeed be seen that the pulses 54, 56 on this line are not synchronised with the clock ck.

The lowermost line, data, shows the output from the circuit portion. On the rising edge of the first pulse 54 in data_a at time t1, the data line is zero and thus dissimilar inputs exist on the corresponding XOR gate 48, which causes its output to go high and thus the output reqCk of the subsequent OR gate 52 to go high as may be seen on the third line. This in turn opens the clock AND gate 42 which couples the current part of the clock signal ck to generate the gated clock signal ck_g to the clock inputs 44, 46 of the flip-flops. Thus the ck_g line is high during the last part of the current clock pulse 58 until time t2 when the clock line ck goes low at the end of the pulse 58. When the rising edge clock signal is applied to the clock input 44 of the first flip-flop 38, the high on its D input from data_a is transferred to its Q output, data_s. However the small delay (not visible in this diagram) that occurs in practice in this transfer taking place means that the second flip-flop 40 does not see the high in data_s at the moment it receives the rising edge in ck_g at its clock input and so its output, data, remains low.

At time t3 the next clock pulse 60 is initially transferred onto ck_g but this rising edge now causes the high on data_s to be transferred across the second flip-flop 40 to cause its output, data to go high. The result of this is that the inputs on both XOR gates 48, 50 are all high so that a short time later at time t4 (t4-t3 being the propagation delay) the output reqCk of the OR gate 52 goes low, thereby closing the clock gate 42. The two resulting pulses on the ck_g line are rather short, but are sufficient for the flip-flops 38, 40 to function adequately.

The signals remain unchanged until time t5 when the data_a line changes again by going from high to low. As before the imbalance on the XOR gate 48 sends the reqCK high and turns on the clock gate 42. As the clock signal ck happens to be low at the time there is no immediate change in the outputs of the flip-flops 38, 40 but at time t6 when the next rising edge occurs on the clock pulse, ck this transfers the low on data_a to data_s. The clock gate 42, remains open (because data remains high while data_a is low) and thus the next rising clock pulse edge at t7 is transmitted to the flip-flops, notably the second flip-flop 40 causing the low in its D input data_s to be transferred to its output, data. The XOR inputs data_a, data_s and data are therefore once more all in balance and so a short time later the reqCk line is pulled low and the clock gate 42 is closed. Again this leads to a very short pulse on ck_g but this does not cause any particular problems as it is longer than the minimum pulse required for reliable operation.

The next change in data_a is at time t8 and it will be noted that this is very close to the falling edge of the current clock pulse 62. This results in an extremely short pulse on ck_g which causes the first flip-flop 38 to go into a meta-stable state as indicated by the sloping, indeterminate level on line data_s. The second flip-flop 40 will not enter a meta-stable state even with such a very short clock pulse since the Q output, data is the same as the D input, data_s.

It can be assumed that during the next clock cycle the flip-flop 38 settles to a definite state (output high or low) so that by the time of the next rising edge at time t9, the meta-stable state has been resolved—e.g. with data_s high in this example which is in turn propagated to the output, data, of the second flip-flop 40 in the manner previously described. This leads, after a short delay, to reqCk going low again and the clock gate 42 being closed.

A similar problem occurs at time t10 when data_a goes high at the same time as a rising edge on the clock ck. The output of the first flip-flop, data_s goes into a meta-stable state. However this is resolved by the time of the next rising edge on ck at time t11 with data_s low. In this example it also happens to send the output, data, of the second flip-flop low and so the reqCk and ck_g go low a short time later as described above. Clearly given the meta-stability on data_s this may not have been the case, and then the clock gate 42 would have stayed open for an extra clock cycle to propagate the now-resolved low state on data_s to data.

It may be seen therefore that the asynchronous data line data_a has been synchronised with the clock signal ck on the output data as required but moreover that for significant portions of the time (e.g. up to t1, t4-t5, t7 to t8) while the clock gate 42 was closed, the power consumption is reduced while the clock tree behind the clock signal ck 'sees' only the input capacitance of the AND gate 42 rather than the considerably higher input capacitance of the two flip-flops 38, 40 which in normal circumstances substantially outweighs the provision of the additional XOR gates 48, 50 and OR gate 52. Moreover although the flip-flops see short clock pulses and an apparently erratic clock frequency (the apparent period changes from example from t1-t3 to t6-t7 then t9 to t10 etc) which causes temporary meta-stability on data_s, no meta-stability is seen on the output, data of the circuit portion.

It might be concluded from the above description that the second XOR gate 50 comparing data_a and data_s is not required, and indeed it is not essential. However it has been found beneficial to include just to ensure that the arrangement does not get inadvertently locked into a particular state.

FIG. 7 shows a similar timing diagram for the self-gating reset arrangement shown in FIG. 4. Thus when arst_a goes high at time t1, this causes reqCK to go high and causes both arst_s and arst to go high immediately too. Because the clock signal ck is high, this generates an immediate rising edge in ck_g.

Next at time t2, arst goes low again but the outputs of the two flip-flops 30, 32 remain high until the next rising edge of the clock ck at time t3. This clocks the first flip-flop 34 and so sends its Q output, arst_s low again. On the next positive clock edge at t4 the low state is clocked through the second flip-flop 36 to the final output arst which means that the AND gate 28 controlling the clock signal ck is closed sending the gated clock signal ck_g low.

When the asynchronous reset arst_a next goes high at t5 this immediately sends arst_s and arst high, and so reqCk goes high and the clock signal ck is coupled to the respective clock inputs 30, 32. When arst_a goes low again at t6 this coincides with a rising edge of the clock pulse ck and so causes a meta-stable state in arst_s. Because of the small propagation delay through the first flip-flop 34, the second flip-flop 36 does not see this on its input at the same time as it sees the rising clock edge and so arst remains high and the clock gate 28 remains open. However the meta-stable state in arst_s is resolved at t7 when the next rising edge in the clock input ck_g arrives. The rising clock edge pulls arst_s low to reflect the grounded D input to the first flip-flop 34. This is then clocked through the second flip-flop 36 on the subsequent rising edge in its clock input signal ck_g at t8 which pulls arst low and closes the clock gate 28.

A similar sequence takes place in response to the next pulse 64 in arst_a, the timing of which gives rise to a very short clock pulse 66 being propagated to the two clock inputs 30, 32. However this does not matter as the SET inputs are active so that the clock inputs 30, 32 are disregarded.

The result of this arrangement is that a reset signal arst is provided in which the falling edges are synchronised with the clock ck. Moreover the closure of the clock gate 28 (represented by the extended low portions of ck_g) again gives rise to a saving in power as compared to clocking the flip-flops 34, 36 continuously. The arst signal output is not at risk of going into a meta-stable state, regardless of when transitions in arst_a take place relative to the clock pulses. Of course a set of embodiments (not shown) could employ active low resets connected to the clear (CLR) inputs and inverted control logic without departing from the scope of the invention.

FIG. 8 shows an arrangement similar to that shown in FIG. 5 but with three flip-flops 68, 70, 72 being controlled by the AND clock gate 74, for example where more than two flip-flops are required for synchronisation. Three XOR gates 76, 78, 80 are provided to compare the Q outputs of the three respective flip-flops 68, 70, 72 with the asynchronous data input line data_a. These feed a three input OR gate 82 which controls the clock gate 74. Operation of this embodiment is almost identical to that of FIG. 5 except that it will of course in general take an extra clock cycle to clock data through from data_a to the final output, data. The arrangement can of course be further scaled to employ as many flip-flops in series as are required. Comparisons between the data input line and some or all of the intermediate outputs may be omitted if required as explained with reference to FIG. 5. Also more than two flip-flops may be used for reset synchronisation.

FIG. 9 shows an arrangement which may be used for self-gating a bus comprising three synchronous data lines data_a_0, data_a_1 and data_a_2. It is essentially a scaling up of the arrangement shown in FIG. 3 and therefore subject to the constraints set out in respect of that arrangement. Each data line has a corresponding flip-flop 84, 86, 88 and a corresponding XOR gate 90, 92, 94 comparing its respective D input (the data line) with its Q output. The XOR gates 90, 92, 94 feed a three-input OR gate 96 which is used to control the clock gating AND gate 98 controlling the coupling of the clock signal ck to the clock inputs of all three flip-flops 84, 86, 88. Operation is similar to that of the single register in FIG. 3 except that the clock signal ck will be provided to all the flip-flops of the bus 84, 86, 88 whenever there is data to be transferred on the bus. However there is an even greater power saving available when there is no data to be transferred compared with providing a continuous clock signal to three flip-flops.

Such an arrangement can be scaled to provide any desired number of data lines and can also be expanded to include multiple flip-flops for each data line if required for ensuring that meta-stable states in the outputs do not arise. Of course the power saving available scales up with the number of lines in the bus.

Finally FIG. 10 shows essentially a combination of the arrangements of FIGS. 4 and 5. The main difference is that rather than individual AND clock gates being provided, a single, common AND gate 100 is used to control the clock signal ck to all four flip-flops 102, 104, 106, 108. The clock gate 100 is controlled by an OR gate 110 which opens the gate if either portion of the circuit requires a clock signal. As previously described with reference to FIGS. 4 and 5 respectively, this is dictated by the Q output of flip-flop 104, namely arst, directly, for the reset synchronisation portion and by a comparator arrangement comprising two XNOR gates 112, 114 and a NOR gate 116 for the data synchronisation portion. The use of XNOR and a NAND gate rather than XOR and OR gives a logically equivalent arrangement as that used in FIG. 5 but with a marginal additional power saving.

It will be appreciated by those skilled in the art that only a small number of the vast number of different possible arrangements have been described here and the invention should not be considered as limited to these embodiments. The description has been given based on D flip-flops but the principles may be applied to other types in accordance with the invention.

The invention claimed is:

1. A reset synchronisation logic circuit comprising:
a first flip-flop having a first data input connected to a fixed logic level, a first clock input and a first output;
a second flip-flop having a second data input, a second clock input and a synchronised reset output;
a clock signal; and
a gate between said clock signal and said first and second clock inputs, said gate being arranged selectively to couple the clock signal to the first and second clock inputs in dependence upon the output of the second flip-flop.

2. The reset synchronisation logic circuit as claimed in claim 1 wherein said gate comprises an AND gate, a NAND gate or a logically equivalent arrangement.

3. The reset synchronisation logic circuit as claimed in claim 1 wherein said first and second flip-flops are arranged in series.

* * * * *